United States Patent  (10) Patent No.: US 6,569,726 B1
Lee et al.  (45) Date of Patent: May 27, 2003

(54) METHOD OF MANUFACTURING MOS TRANSISTOR WITH FLUORIDE IMPLANTATION ON SILICON NITRIDE ETCHING STOP LAYER

(75) Inventors: Tong-Hsin Lee, Taipei Hsien (TW); Terry Chung-Yi Chen, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/154,604

(22) Filed: May 22, 2002

(65) Prior Publication Data (65)

Related U.S. Application Data

(62) Division of application No. 10/004,635, filed on Dec. 4, 2001.

(30) Foreign Application Priority Data

Nov. 19, 2001 (TW) ........................................ 90128570 A

(51) Int. Cl.$^7$ ........................................... H01L 21/8238
(52) U.S. Cl. ........................ 438/200; 438/153; 438/238; 438/527
(58) Field of Search ................................ 438/200, 153, 438/155, 238, 247, 250, 407, 527, 528, 919, 655–657

(56) References Cited

U.S. PATENT DOCUMENTS 6,335,249 B1 * 1/2002 Thei et al. .................. 438/296
6,436,783 B1 * 8/2002 Ono et al. .................. 438/366

* cited by examiner

Primary Examiner—Carl Whitehead, Jr.
Assistant Examiner—Yennhu Huynh
(74) Attorney, Agent, or Firm—J.C. Patents

(57) ABSTRACT

A method of manufacturing a MOS transistor. A substrate having a gate oxide layer, a gate electrode and spacers attached to the sidewalls of the gate electrode is provided. A source/drain (S/D) implantation is conducted to form a source/drain region in the substrate on each side of the gate electrode. A self-aligned silicide (Salicide) process is carried out to form a self-aligned silicide layer over the exposed gate electrode and source/drain region. A silicon nitride layer serving as an etching stop is formed over the substrate. A fluoride blanket implantation of the silicon nitride etching stop layer is carried out using an implantation dosage of about $5 \times 10^{13} \sim 5 \times 10^{14}$ cm$^{-2}$ and at an implantation energy level between 2 KeV~5 KeV. The fluorides implanted into the silicon nitride layer capture hydrogen within the silicon nitride layer, thereby reducing free hydrogen concentration and increasing threshold voltage stability of the MOS transistor.

5 Claims, 4 Drawing Sheets

METHOD OF MANUFACTURING MOS TRANSISTOR WITH FLUORIDE IMPLANTATION ON SILICON NITRIDE ETCHING STOP LAYER

CROSS-REFERENCE TO RELATED APPLICATION

This application is a divisional application of, and claims the priority benefit of, U.S. application Ser. No. 10/004,635 filed on Dec. 04, 2001 pending.

BACKGROUND OF THE INVENTION

1. Field of Invention

The present invention relates to a method of manufacturing a semiconductor device. More particularly, the present invention relates to a method of manufacturing a metal-oxide-semiconductor (MOS) transistor.

2. Description of Related Art

Very large scale integration (VLSI) circuits having a narrower line width is now packaged inside an ever-increasing silicon wafer. Such trend enables the inclusion of more functions into an identical piece of silicon chip resulting in a drop in price. To increase market competition, semiconductor manufacturer routinely integrates read-only-memory (ROM), static random access memory (SRAM), flash memory or dynamic random access memory (DRAM) with logic circuits and digital circuit together on the same piece of silicon chip. Such integrated produces a light, thin and compact chip often referred to as a system on chip (SOC).

Forthcoming generation of system chips all attempts to produce breakthrough in dimensional reduction and reliability improvement. To produce a system chip having a smaller dimension and higher reliability and to provide sufficient metallic interconnects within limited chip area for linking up devices, borderless contact technique is necessarily employed.

To shrink device dimension, conventional method of manufacturing the P-channel metal-oxide-semiconductor (PMOS) of a DRAM within the system chip includes forming gate electrode and gate spacers on a substrate. Thereafter, ions are implanted into the substrate to form source/drain regions. The method of producing a borderless contact includes forming a silicon nitride layer over the substrate and conducting a borderless contact etching using the silicon nitride layer as an etching stop.

However, the aforementioned method of using the silicon nitride layer to serve as an etching stop may lead to threshold voltage (Vt) stability problem. This is because silicon nitride contains some hydrogen atoms that may diffuse during a thermal treatment. Ultimately, the presence of atomic hydrogen inside the silicon nitride layer affects the performance of the MOS transistor. The situation is made worse after a reduction in device dimension. To lower junction leakage, a low thermal budget method such as plasma-enhanced chemical vapor deposition (PECVD) is used to form the silicon nitride layer. During plasma deposition of silicon nitride, hydrogen atoms within the plasma reacts with unsaturated/unbonded silicon atoms and nitrogen atoms to form Si—H and N—H bonds. Consequently, concentration of hydrogen atoms within the silicon nitride layer is extremely high leading to serious threshold voltage instability after thermal diffusion.

SUMMARY OF THE INVENTION

Accordingly, one object of the present invention is to provide a method of manufacturing a metal-oxide-semiconductor (MOS) transistor capable of reducing concentration of hydrogen within a silicon nitride etching stop layer.

A second object of this invention is to provide a method of manufacturing a MOS transistor capable of improving threshold voltage stability.

A third object of this invention is to provide a method of manufacturing a MOS transistor capable of improving reliability of the MOS transistor.

To achieve these and other advantages and in accordance with the purpose of the invention, as embodied and broadly described herein, the invention provides a method of manufacturing a MOS transistor. A substrate having a gate oxide layer, a gate electrode and spacers attached to the sidewalls of the gate electrode is provided. A source/drain (S/D) implantation is conducted to form a source/drain region in the substrate on each side of the gate electrode. A self-aligned silicide (Salicide) process is carried out to form a self-aligned silicide layer over the gate electrode and the source/drain regions. A silicon nitride layer serving as an etching stop is formed over the substrate. A fluoride blanket implantation of the silicon nitride etching stop layer is carried out using an implantation dosage of about $5 \times 10^{13} \sim 5 \times 10^{14}$ cm$^{-2}$ and at an implantation energy level between 2 KeV~5 KeV.

The embodiment of this invention can be applied to the fabrication of a static random access memory (SRAM). First, a substrate having a gate structure thereon is provided. The gate structure includes a gate oxide layer, a gate electrode, gate spacers on sidewalls of the gate electrode and a pair of source/drain regions. A self-aligned silicide layer is formed over the gate electrode and the source/drain regions using a self-aligned silicide process. A silicon nitride layer that serves as an etching top layer is formed over the substrate. A fluoride blanket implantation of the silicon nitride etching stop layer is carried out. The fluoride blanket implantation is conducted using an implantation dosage of about $5 \times 10^{13} 5 \times 10^{14}$ cm$^{-2}$ and at an implantation energy level between 2 KeV~5 KeV. A dielectric layer is formed over the substrate. The dielectric layer is patterned to form a borderless contact opening that exposes a portion of the silicon nitride etching stop layer. The exposed silicon nitride etching stop layer is removed. A metallic layer is formed over the substrate completely filling the borderless contact opening. A chemical-mechanical polishing operation is conducted to remove excess metallic material over the borderless contact opening. Finally, conventional steps necessary for forming the remaining parts of the SRAM is carried out.

In this invention, a low-energy fluoride blanket implantation is conducted after the formation of the silicon nitride etching stop layer. The fluoride atoms capture most of the hydrogen inside the silicon nitride layer so that threshold voltage is stabilized and reliability of the transistor device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
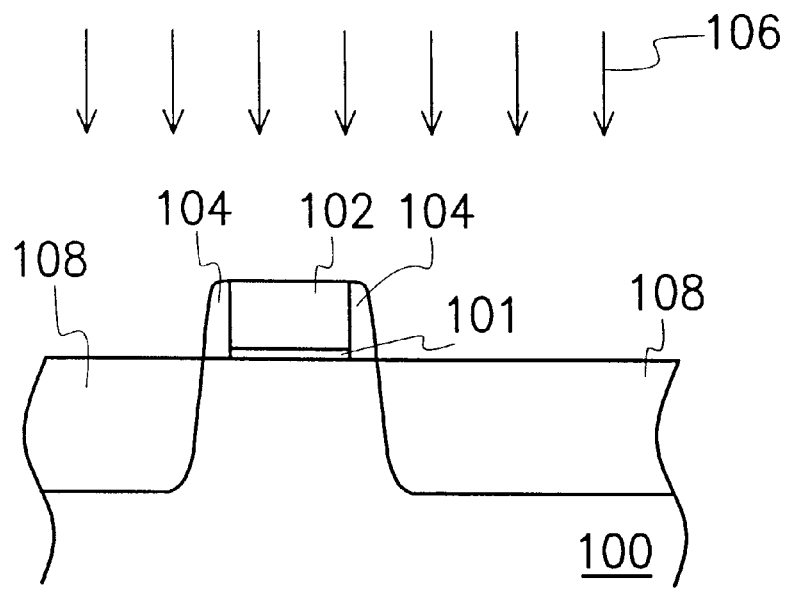
FIGS. 1A through 1G are schematic cross-sectional views showing the progression of steps for manufacturing a static random access memory according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the progression of steps for manufacturing a static random access memory according to one preferred embodiment of this invention. As shown in FIG. 1A, a substrate 100 having a gate structure thereon is provided. The gate structure includes a gate oxide layer 101, a gate electrode 102 and sidewall spacers 104. A source/drain (S/D) implantation 106 is conducted to form source/drain regions 108 in the substrate 100 on each side of the gate structure.

Figure 1B:
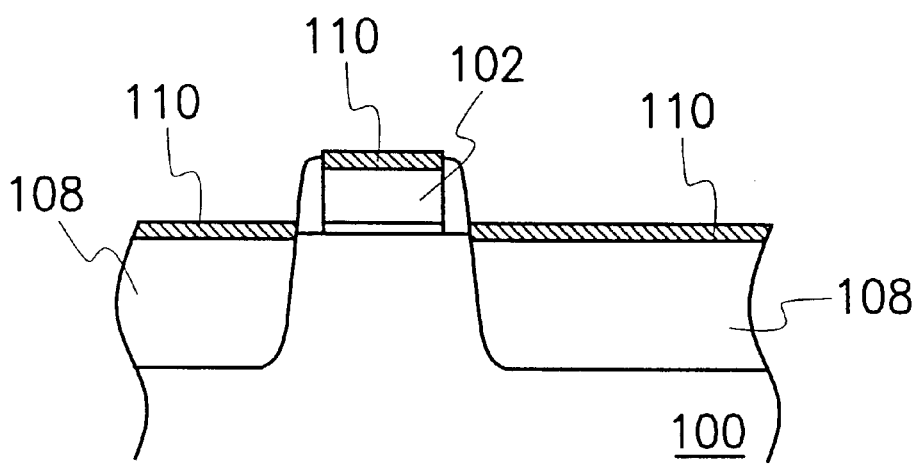

As shown in FIG. 1B, a self-aligned silicide layer 110 is formed over the exposed surface of the gate electrode 102 and the source/drain regions 108. The silicide layer 110 is, for example, selected from a group consisting of titanium silicide, cobalt silicide, nickel silicide, platinum silicide and palladium silicide. To form the self-aligned silicide layer 110, metallic material is deposited over the substrate 100 and the gate electrode 102. The metallic material is a basic metal selected from a group consisting of titanium, cobalt, nickel, platinum and palladium, but preferably titanium. A thermal treatment is conducted so that metal reacts with silicon in the gate electrode 102 and source/drain regions 108 to form metal silicide layers. Lastly, unreacted metal is removed to expose the self-aligned silicide layers 110.

Figure 1C:
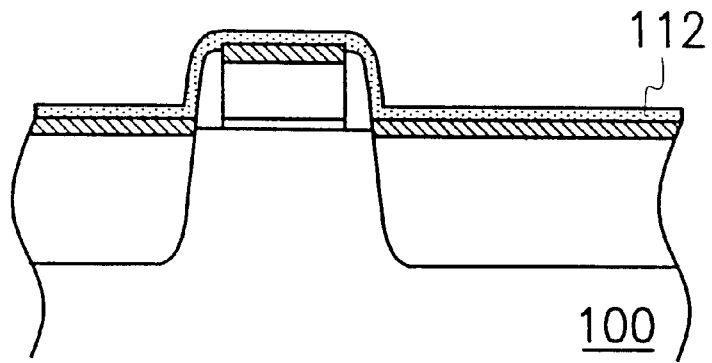

As shown in FIG. 1C, a silicon nitride layer 112 is formed over the substrate 100 and the exposed device surfaces. The silicon nitride layer 112 serves as an etching stop layer for forming a borderless contact. Although the materials for forming various components are disclosed as described, other modification of materials is also within the scope of this invention as long as such change follows the rules and spirit of the embodiment.

Figure 1D:
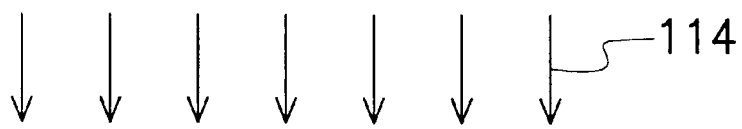
Figure 1D:
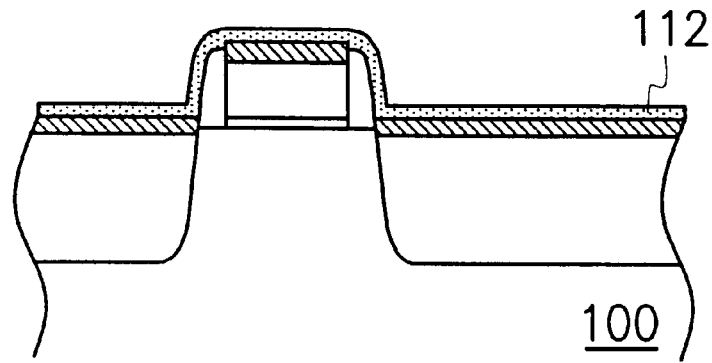

As shown in FIG. 1D, a fluoride blanket implantation 114 of the silicon nitride layer 112 is carried out. Dosage and energy level used in the implantation 114 is controlled within definite limits so that hydrogen concentration within the silicon nitride layer 112 is lowered. The fluoride blanket implantation is preferably carried out using a dosage between $5 \times 10^{13} \sim 5 \times 10^{14}$ cm$^{-2}$ and at an energy level between 2 KeV~5 KeV.

Figure 1E:
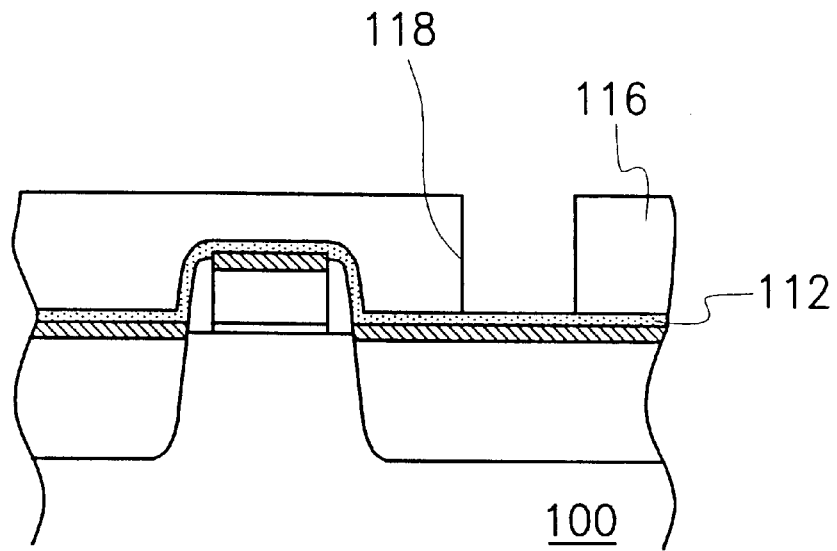

As shown in FIG. 1E, a dielectric layer 116 such as a silicon oxide layer is formed over the substrate 100. The dielectric layer 116 is patterned to form a borderless contact opening 118 that exposes a portion of the silicon nitride etching stop layer 112.

Figure 1F:
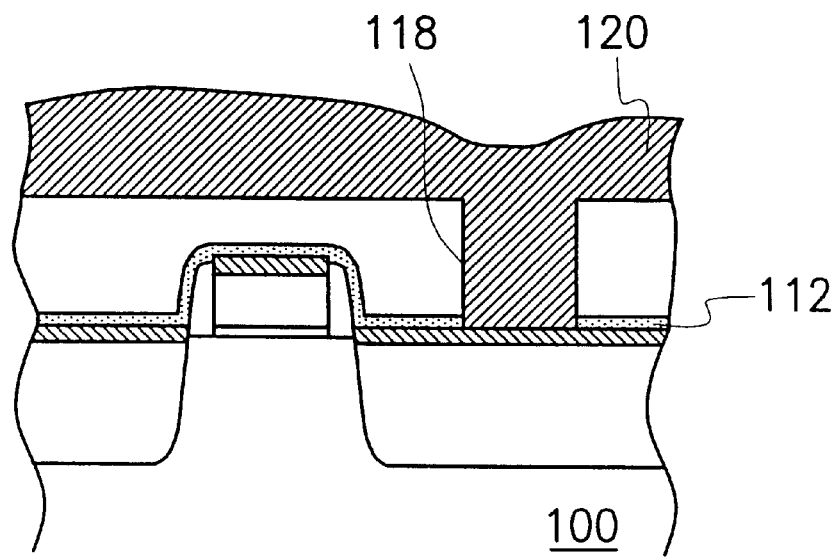

As shown in FIG. 1F, the exposed silicon nitride etching stop layer 112 is removed. A metallic layer 120 such as a tungsten layer is formed over the substrate 100 completely filling the borderless contact opening 118.

Figure 1G:
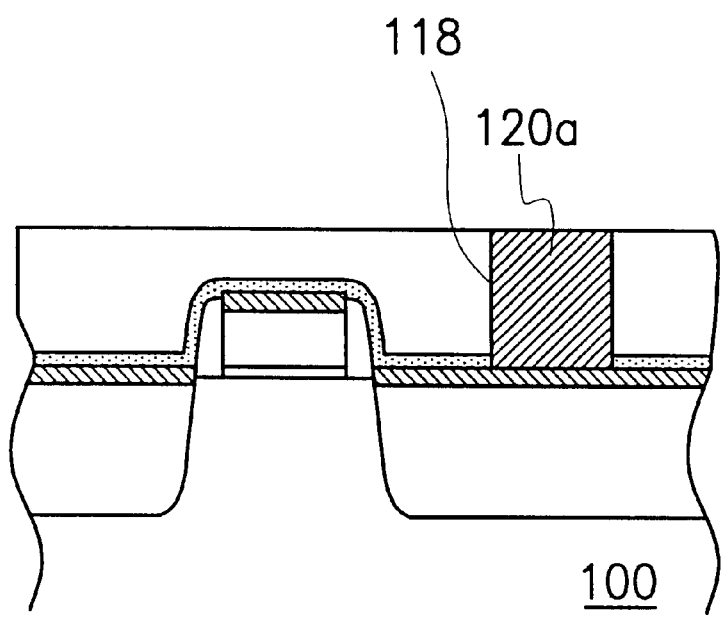

As shown in FIG. 1G, a chemical-mechanical polishing operation is conducted to remove excess metallic material outside the borderless contact opening 118, thereby forming a borderless contact 120a. Finally, remaining components of the SRAM are formed using conventional techniques.

In summary, major aspects of this invention includes:

1. A low-energy fluoride blanket implantation of the silicon nitride etching stop layer is conducted so that most of the hydrogen atoms within the silicon nitride layer are captured by fluoride. Hence, concentration of hydrogen atoms within the silicon nitride layer is greatly reduced so that reliability of the device is very much improved.

2. The lowering of hydrogen concentration within the silicon nitride layer due to fluoride blanket implantation also increases threshold voltage stability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device, comprising the steps of:

providing a substrate having a gate structure thereon, wherein the gate structure includes a gate oxide layer, a gate electrode over the gate oxide layer and a spacer on a sidewall of the gate electrode;

forming source/drain regions in the substrate on each side of the gate structure;

forming self-aligned silicide layers over the exposed gate electrode and the source/drain regions of the gate structure;

forming a silicon nitride etching stop layer over the substrate;

conducting a fluoride blanket implantation on the silicon nitride etching stop layer;

forming a dielectric layer over the substrate;

patterning the dielectric layer to form a borderless contact opening that exposes a portion of the silicon nitride etching stop layer;

removing the exposed silicon nitride etching stop layer;

forming a metallic layer over the substrate completely filling the borderless contact opening;

conducting a chemical-mechanical polishing operation to remove excess metallic material outside the borderless contact opening.

2. The method of claim 1, wherein the fluoride blanket implantation is conducted using a dosage between $5 \times 10^{13} \sim 5 \times 10^{14}$ cm$^{-2}$.

3. The method of claim 1, wherein the fluoride blanket implantation is conducted at an energy level between 2 KeV~5 KeV.

4. The method of claim 1, wherein the metallic layer includes a tungsten layer.

5. The method of claim 1, wherein material constituting the self-aligned silicide layers is selected from a group consisting of titanium silicide, cobalt silicide, nickel silicide and palladium silicide.

* * * * *